United States Patent [19] [11] Patent Number: 4,549,441
Chaki [45] Date of Patent: Oct. 29, 1985

[54] ARM MECHANISM OF A PUSHBUTTON TYPE TUNER
[75] Inventor: Takao Chaki, Tokyo, Japan
[73] Assignee: Clarion Co., Ltd., Tokyo, Japan
[21] Appl. No.: 493,543
[22] Filed: May 11, 1983
[30] Foreign Application Priority Data
 May 14, 1982 [JP] Japan .............................. 57-70367[U]
[51] Int. Cl.[4] ................................................ H03J 5/12
[52] U.S. Cl. ...................................... 74/10.33; 334/7
[58] Field of Search ........................... 74/10.33; 334/7
[56] References Cited
 U.S. PATENT DOCUMENTS
 4,331,038  5/1982  Naoi ..................... 74/10.33
 4,478,097 10/1984  Tanaka .................. 74/10.33
 FOREIGN PATENT DOCUMENTS
 55-107324  8/1980  Japan ..................... 74/10.33

Primary Examiner—Allan D. Herrmann
Attorney, Agent, or Firm—Flynn, Thiel, Boutell & Tanis

[57] ABSTRACT

Arm mechanism of a pushbutton type tuner, in which a setting plate is rotatably mounted on an arm, which setting plate has an arc shaped contacting part on the extremity side of the arm; at the periphery of the setting plate is disposed an approximately U-shaped plate spring having an open end on the base side of the arm, which plate spring is fixed to the arm on the extremity side of the arm; on the inner side of the plate spring is formed a tightening part against the contacting part of the setting plate; and a pair of tightening protrusions are disposed on the tightening part, interposing the center line of the arm therebetween, in contact with the contacting part of the setting plate, whereby both the tightening protrusions are comprised between 50° and 70°, measuring from the center line of the arm with respect to the center of rotation of the setting plate.

3 Claims, 4 Drawing Figures

FIG. I
PRIOR ART
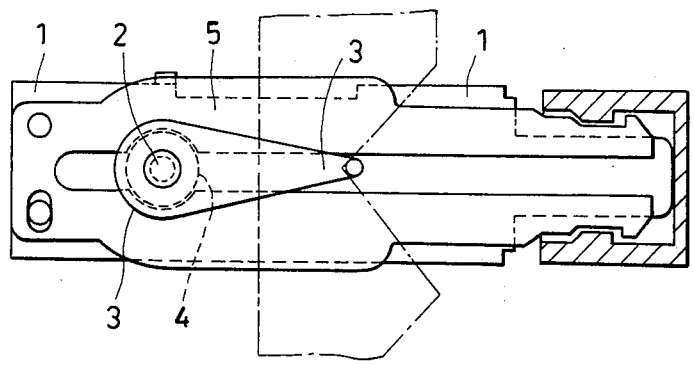
FIG. 4
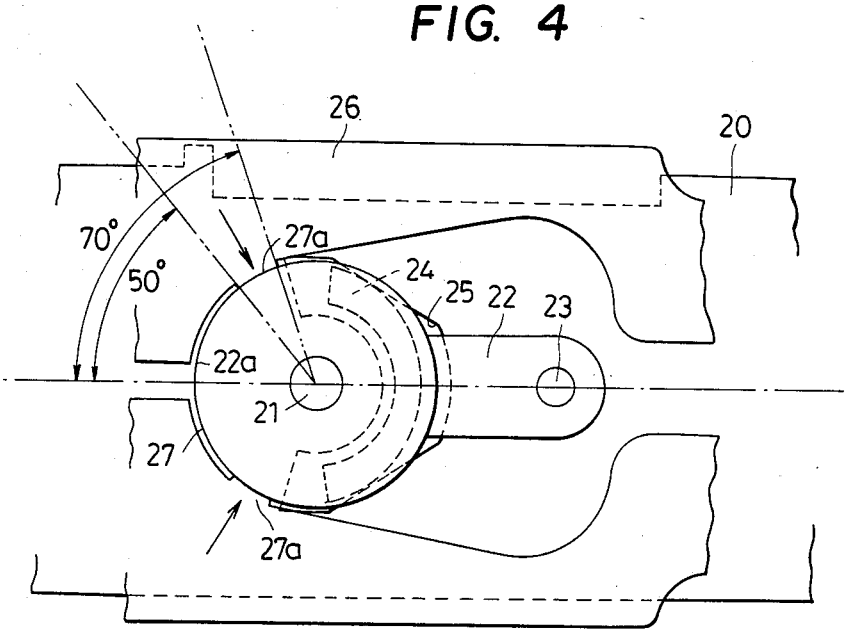

ARM MECHANISM OF A PUSHBUTTON TYPE TUNER

BACKGROUND OF THE INVENTION

This invention relates to an arm mechanism of a pushbutton type tuner.

A pushbutton type tuner is a tuner, in which one among several predetermined frequencies is selected by inserting a core linked with a memory slide to a corresponding position in a tuning coil, whereby displacement of the memory slide is adjusted by adequately varying the angular position of a setting plate mounted on an arm so as to press the memory slide, which setting plate is fixed after adjustment.

In such a pushbutton type tuner, in order to fix the setting plate to an arm at a desired angular position, heretofore a structure as indicated in FIG. 1 has been utilized. In this structure, on the upper surface of an arm 1 a setting plate 3 is mounted rotatably by using a setting pin 2 having a frange at its upper end. A boss 4 having a circular periphery is formed in one body on the lower surface of the setting plate 3. The periphery of this boss 4 is surrounded by a plate spring 5 having an approximately U-shape. By pressing this plate spring 5 on both the sides by using a pushbutton, the periphery of the boss 4 is tightly grasped by the plate spring 5 so that the setting plate 3 fixed to the arm at a desired angular position cannot rotate around the setting pin 2.

In such an arm mechanism, since the setting plate 3 is pressed laterally from right and left by the plate spring 5, the overall thickness of the arm mechanism may be reduced and thus contributes considerably to miniaturization and thinning of the pushbutton type tuner. However, utilization of such an arm mechanism in a pushbutton type tuner has given rise to following inconveniences.

That is, since the setting plate 3 should be mounted rotatably with respect to the setting pin 2, certain space rests necessarily between the setting pin 2 and the wall of the hole formed for it in the setting plate 3. Consequently this space has given rise to some shakiness and it has been feared that the position of the setting plate with respect to the arm when the setting plate rotated was different from that observed when it rested. If the position of the center of the setting plate is not well fixed, it is difficult to position exactly the setting plate in accordance with the frequency to be selected. Displacement of the center provokes displacement in frequency and thus lowers considerably the quality of the tuner.

In order to remove these inconveniences, it can be supposed to eliminate the shakiness by pressing the setting plate 3 always in one direction, for example toward the base side of the arm 1, so that the setting pin 2 and the wall of the hole in the setting plate 3 is in contact always at a well defined position, when the setting plate 3 is pressed by the plate spring.

However, it has been extremely difficult to press the setting plate 3 only in one direction by using one plate spring 5 while fixing it with a high reliability so that the setting plate 3 once fixed never rotates. Specifically, in order to press the setting plate 3 only in one direction, contact position of the setting plate 3 with the plate spring can be disposed only in the pressing direction and contact area is correspondingly reduced. Therefore, even if shakiness is prevented, the small contact area gives rise to a disadvantage that the setting plate is inadvertently rotated. Of course, when pressing force exerted by the plate spring 5 is extremely strong, even if the setting plate is pressed only in one direction, it can be fixed with a high reliability. However, since pressing force by such a plate spring 5 is based on the force required at the moment when a pushbutton surmounts two tapered parts disposed at the base part of the plate spring, the pressing force caused by the plate spring is limited by the fact that the mounting operation of the pushbutton should be effected smoothly. The pressing force has, therefore, not been able to be increased imprudently.

OBJECT OF THE INVENTION

An object of this invention is to provide a new arm mechanism of the pushbutton type tuner, in which the setting plate is fixed with a high reliability by the plate spring by using effectively pressing force exerted by the plate spring and at the same time the center of the setting plate is always at a same position so that there is no fear that any displacement in frequency is provoked.

SUMMARY OF THE INVENTION

In order to achieve this object, the arm mechanism of the pushbutton type tuner according to this invention is characterized in that an arc shaped contacting part is disposed at the forward periphery of the setting plate, that a pair of tightening protrusions are disposed at the inner side of the approximately U-shaped plate spring, interposing the center line of an arm on which the setting plate is rotatably mounted, in contact with the contacting part, and that the tightening protrusions are comprised between 50° and 70° measuring from the center line of the arm with respect to the center of rotation of the setting plate. By this way, when the setting plate is tightened by the plate spring, fixing force exerted on the setting plate by the tightening protrusions is increased by a factor of one to three with respect to the force exerted on the setting plate by the pushbutton in order to prevent displacement of the setting plate.

BRIEF DESCRIPTION OF THE DRAWING

FIG. 1 is a plan view of a prior art arm mechanism;

FIG. 4 an enlarged view of a part in FIG. 2.

DETAILED DESCRIPTION OF PREFERRED EMBODIMENTS

Figure 2:
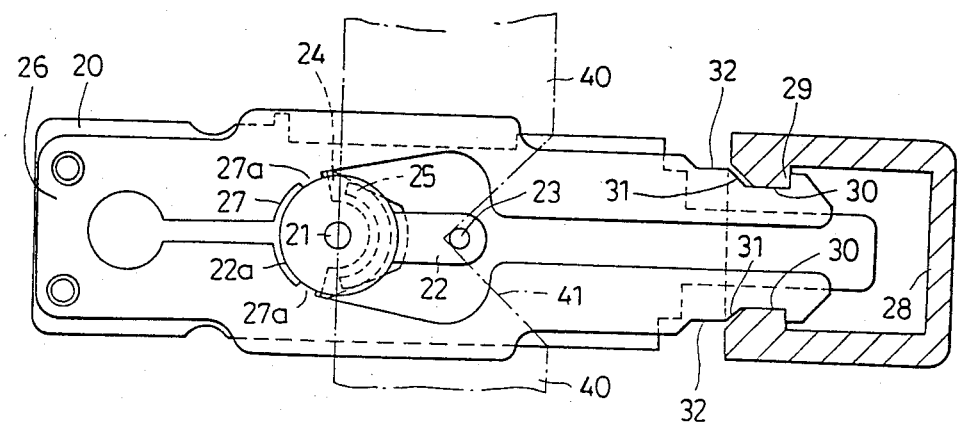
FIG. 2 is a plan view of an arm mechanism according to this invention.
Figure 3:
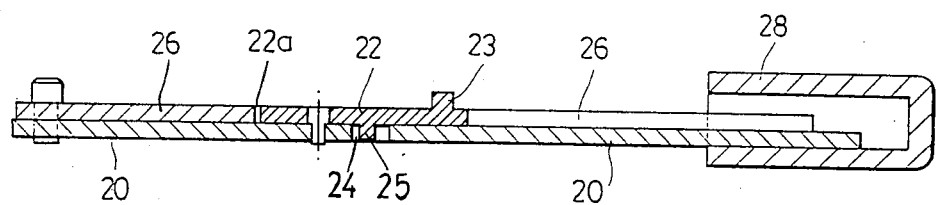
FIG. 3 is a longitudinal cross sectional view of the arm mechanism shown in FIG. 2.

This invention will be explained more concretely referring to an embodiment shown in FIG. 2 and the followings.

In the figures the referring numeral 20 denotes an arm. On this arm 20 a setting plate 22 is mounted rotatably. That is, a setting pin 21 is fixed to the arm 20 and the setting plate 22 is engaged rotatably with this setting pin 21. The setting plate 22 is shaped in an arc form on the extremity side of the arm 20 and this arc shaped part forms a contacting part 22a in contact with the plate spring, which will be explained later. On the other hand, a pressing protrusion 23 is fixed upwardly at the extremity of the setting plate 22 on the base side of the arm 20 and this pressing protrusion 23 is engaged with a V-shaped notch of the memory slide.

On the lower surface of the setting plate 22, a guiding protrusion 25, whose periphery is arc shaped, is formed in one body on the pushbutton side with respect to the setting pin 21. In the arm 20 an approximately V-shaped guiding aperture 24 corresponding to the guiding protrusion 25 is formed on the pushbutton side with respect to the setting pin 21. The above-mentioned guiding protrusion 25 is inserted movably into this guiding aperture 24. This guiding aperture 24 is symmetric with respect to the center line of the arm 20 passing through the center of the setting pin 21 and its outer edge is tapered so that the whole aperture has a V-shape pointing the base side of the arm 20. These two tapered parts are in contact with the arc shaped periphery of the above-mentioned guiding protrusion 25.

On the upper surface of the arm 20 an approximately U-shaped plate spring 26 is disposed so as to surround the setting plate 22. This plate spring 26 is fixed at its extremity at the extremity of the arm 20 and its two branches, right and left, extend toward the base side of the arm, forming a U-shape, so as to hold the setting plate 22 between them. An arc shaped tightening part 27 is formed against the arc shaped contacting part 22a of the setting plate 22 at the inner edge on the extremity side of the arm. On this tightening part 27 a pair of tightening protrusions 27a are disposed, interposing the center line of the arm 20. These tightening protrusions 27a are so formed that the center of each protrusion is between 50° and 70°, measuring from the center line of the arm 20 with respect to the center of the setting pin 21.

Furthermore, the base part of the arm 20 and the extremity of the right and left branches of the plate spring 26 extending to the base part of the arm 20 are engaged with a pushbutton 28. When this pushbutton 28 is mounted on the arm, it presses the extremity of the right and left branches of the plate spring 26 toward the center line and reduces the distance between them. When the pushbutton is extracted half-way, the pressing force exerted on the plate spring 26 is removed and it becomes possible to enlarge the distance between the two branches. For this purpose, a pair of protrusions 29, right and left, are disposed at the inner side of the pushbutton 28. On each branch of the plate spring a release part, where the distance between the outer edge and the corresponding edge of the other branch is smaller than the other parts, a tapered part 31 adjacent to the release part 30, and a thrust part 32, where the distance between the outer edge and the corresponding edge of the other branch is greater than the other parts, are formed as a cam plate at the base part of the plate spring 26 corresponding to the protrusions 29 of the pushbutton 28.

The working of the arm mechanism according to this invention, which is constructed as indicated above, will be explained hereinbelow.

For setting frequencies to be selected by using the pushbuttons for given pushbuttons and arms belonging to them, the tuning shaft is beforehand rotated manually, and the core linked with the shaft is displaced to a determined position in the tuning coil. On the other hand a pushbutton corresponding to a frequency to be selected is pushed in. By this way, the memory slide 40 linked with the core is displaced laterally and stopped at a position corresponding to the frequency to be set. At this situation the pushbutton 28 mounted on the base part of the arm 20 and that of the plate spring 26 is extructed half-way so that the protrusions 29 are located at the release parts 30 of the plate spring 26. At this moment the pressing force exerted on the plate spring 26 by the pushbutton is released, and this gives rise to clearance between the tightening protrusions 27a of the plate spring 26 and the contacting part 22a of the setting plate so that the setting plate 22 can rotate freely around the setting pin 21.

At this situation, when the pushbutton 28 and the arm 20 are pushed into the tuner, the pressing protrusion 23 of the setting plate 22 comes into contact with the V-shaped notch 41 of the memory slide 40, and guided by one of the slopes, reaches the vertex of the V-shaped notch 41. In this case, since the position of the vertex of the V-shaped notch 41 is determined by the position of the memory slide 40 corresponding to the core in the tuning coil, the setting plate 22 rotates around the setting pin 21 so that the pressing protrusion 23 is located at the vertex of the V-shaped notch 41.

By this way, when the arm 20 is pushed into the tuner and the pressing protrusion 23 is engaged with the V-shaped notch 41 of the memory slide 40, the setting plate 22 is pulled by the V-shaped notch 41 and tends to move toward the base side of the arm 20. At this moment the guiding protrusion 25 disposed on the lower surface of the setting plate 22 comes into contact with the V-shaped edge of the guiding aperture 24 formed in the arm 20 and moves along the edge toward the base side of the arm 20. Consequently, even if there is some clearance between the setting plate 22 and the setting pin 21 and even if the setting plate is movable, the guiding protrusion 25 of the setting plate 22 pulled by the memory slide 40 comes into contact with the deepest part of the V-shaped guiding aperture 24 of the arm 20. In this case, since the V-shaped guiding operture 24 is symmetric with respect to the center line of the arm and since the periphery of the guiding protrusion 25 engaged with the aperture is circular, the center of the setting plate 22 is always on the center line of the guiding aperture 24, that is, on the center line of the arm 20.

By this way, the rotation angle of the setting plate 22 is determined and its center is in position. After that, the pushbutton 28 disposed at the base side of the arm is further pushed in. Since the memory slide 40 prevents forward movement of the arm 20, the pushbutton 28 slides on the arm and thus the pushbutton 28 is mounted completely. At this moment the protrusions 29 disposed on the pushbutton 28 advance from the release part 30 of the plate spring 26 over the tapered part 31 to the thrust part 32 and the base part of the plate spring 26 are pressed laterally toward the center line by the right and left protrusions 29 of the pushbutton 26. As the consequence, the distance between the right and left branches of the plate spring 26 becomes smaller. The tightening protrusions 27a disposed on the plate spring 26 are pressed against the arc shaped contacting part 22a formed on the front part of the setting plate 22 and fixed the setting plate 22 on the arm 20.

Thereafter, when the pushbutton 28 is pushed in the tuner, since the pressing protrusion 23 of the setting plate 22 fixed to the arm is in contact with the V-shaped notch 41 and pushes it, the memory slide 40 is displaced. The position of the core which is linked with the memory slide 40 and inserted in the coil is thus determined.

According to this invention, the tightening protrusions 27a disposed on the plate spring 26 are comprised between 50° and 70°, measuring from the center line of the arm 20 with respect to the center of rotation of the setting plate 22. Consequently, if the force exerted on the setting plate 22 by the tightening protrusions 27a is decomposed into the components in the axial and lateral directions of the arm, the ratio of the former to the latter is comprised between 1.2 and 2.7. This means that the force for fixing the setting plate 22 is always greater than the force for pushing it toward the base part of the arm 20 and preventing its displacement, and further that nevertheless the force for preventing the displacement of the setting plate 22 also rest sufficiently. Consequently it is possible to divide usefully the force exerted on the plate spring 26 by pushing the pushbutton 28 into the fixing force and the force for preventing the displacement of the setting plate 22 and thus, since the force of the plate spring 26 can be effectively utilized, it is not necessary to increase excessively the force exerted by the pushbutton. Consequently, after the release of the engagement of the setting plate 22 with the memory slide 40, the setting plate 22 is pressed so that the guiding protrusion 25 rests always on the center line of the guiding aperture 24. Owing to the force exerted by the plate spring for preventing the displacement of the setting plate 22, the guiding protrusion 25 never diverts from the center line of the arm 20. Consequently there is no fear that any displacement in frequency is provoked. At the same time, since the setting plate 22 is fixed by a pressing force which is great with respect to the force for preventing the displacement of the setting plate 22, it is not feared that the angular position of the setting plate 22 changes. With this respect displacement in frequency is also prevented.

This invention is not limited to the embodiment illustrated in the drawing. The guiding protrusion 25 may not be disposed on the lower surface of the setting plate 22 and the V-shaped guiding aperture 24 need not necessarily be formed in the arm 20. That is, according to this invention, since the tightening protrusions 27a disposed on the plate spring 26 push the setting plate 22 toward the base part of the arm 20, even if there is some clearance between the setting plate 22 and the setting pin 21, the setting plate 22 is pressed always in one well defined direction, and even without V-shaped guiding aperture 24 shown in the embodiment, positioning of the setting plate 22 is effected effectively.

As indicated in the above embodiments, the arm mechanism according to this invention is characterized in that the tightening protrusions disposed on the plate spring, which push the setting plate, are comprised between 50° and 70°, interposing the center line of the arm therebetween, measuring from the center line of the arm with respect to the center of rotation of the setting plate. Owing to this fact, according to this invention, the force exerted on the plate spring by the pushbutton is divided usefully into the force for fixing the setting plate and the force for preventing its displacement, it is not necessary to increase excessively the force exerted by the plate spring and thus shakiness of the setting plate is removed. Therefore displacement in frequency of the tuner is also eliminated. Furthermore, since it is not necessary to increase excessively the force exerted by the plate spring, it is possible to mount and dismount the pushbutton giving rise to the pressing force exerted on the plate spring with a relatively small force. It is another advantage that frequency setting for each arm can be effected more easily.

I claim:

1. Arm mechanism of a pushbutton type tuner including:
    a pushbutton;
    an arm, on the base side of which said pushbutton is mounted;
    a setting plate mounted on said arm rotatably around a setting pin fixed to said arm, said setting plate having an arc shaped contacting part on the extremity side of the arm;
    a memory slide displaceable to select a frequency depending upon which pushbutton is pushed in, said memory slide having a V-shaped notch, with which a pressing protrusion disposed upwardly at the extremity of said setting plate on the base side of the arm is engaged;
    an approximately U-shaped plate spring disposed at the periphery of said setting plate and having an open end on the base side of the arm, said plate spring being fixed to the arm on the extremity side of the arm, the extremity of the two branches of said plate spring being pushed by protrusions disposed at the inner side of said pushbutton toward the center line of the arm so that the distance therebetween becomes smaller, when said pushbutton is completely mounted, and said distance becoming larger, when said pushbutton is extracted half-way;
    a tightening part formed on the inner side of said plate spring against the contacting part of said setting plate; and
    a pair of tightening protrusions disposed on said tightening part, interposing the center line of the arm therebetween in contact with the contacting part of said setting plate;
    whereby, when a pushbutton is mounted completely on the base side of the arm and said plate spring and said protrusions disposed at the inner side of said pushbutton press the extremity of the right and left branches of said U-shaped plate spring toward the center line of the arm to reduce the distance between the extremity of said branches, said tightening protrusions fix said setting plate with respect to the arm and when the pushbutton is extracted half-way, said setting plate is released.

2. Arm mechanism of a pushbutton type tuner according to claim 1, wherein said tightening protrusions are comprised between 50° and 70°, measuring from the center line of the arm with respect to the center of rotation of the setting plate.

3. Arm mechanism of a pushbutton type tuner according to claim 2, wherein on the lower surface of said setting plate, a guiding protrusion is formed in one body on the pushbutton side with respect to the setting pin and an approximately V-shaped guiding aperture corresponding to said guiding protrusion is formed in the arm on the pushbutton side with respect to the setting pin, said guiding aperture being symmetric with respect to the center line of the arm passing through the center of the setting pin and its outer edge being tapered so that the whole aperture has a V-shape pointing the base side of the arm, whereby said guiding protrusion is inserted movably into said guiding aperture.

* * * * *